United States Patent [19]

Chou

[11] 4,173,753
[45] Nov. 6, 1979

[54] INPUT SYSTEM FOR SINO-COMPUTER

[76] Inventor: Hsu Ching Chou, No. 24, Chung Hua 2nd Rd., Kaohsiung, Taiwan

[21] Appl. No.: 835,739

[22] Filed: Sep. 22, 1977

[51] Int. Cl.² ............................................. G06K 9/00
[52] U.S. Cl. .................... 340/146.3 R; 340/146.3 AC
[58] Field of Search ............. 340/146.3 AC, 146.3 H, 340/146.3 R; 364/200, 900

[56] References Cited

U.S. PATENT DOCUMENTS

| 3,325,786 | 6/1967 | Shashoua et al. | 340/146.3 AC |
| 3,665,450 | 5/1972 | Leban | 340/146.3 AC |

OTHER PUBLICATIONS

Stallings, "Approaches to Chinese Character Recognition," *Pattern Recognition,* Apr. 1976, vol. 8, No. 2, pp. 87-98.
Feng et al., "Decompositon of Polygons . . . .," *IEEE Trans. on Computers,* vol. C-24, No. 6, Jun. 1975, pp. 636-650.
Wang, "The Topological Analysis, Classification, and Encoding of Chinese Char. . .," *Proc. of 1st Ins. Joint Conf. on Pattern Rec.,* 1973, pp. 180-186.

*Primary Examiner*—Leo H. Boudreau

[57] ABSTRACT

An input system for Sino-computer characterized by dividing the Chinese characters into six basic strokes, i.e. horizontal, vertical, dot, dash, clockwise and counterclockwise, and giving each kind of stroke a corresponding designated numerical symbol, thereby, according to the exact stroke writing sequence of any character to give each character a spelling number to represent the character, to facilitate and simplify the input operation.

4 Claims, 6 Drawing Figures

| Characters | Strokes in sequence | Spelling numbers |
|---|---|---|
| 上 | ｜ — — | 2 1 1 |
| 天 | — — ／ ＼ | 1 1 4 4 |
| 火 | 、 、 ／ ＼ | 3 3 4 4 |
| 七 | ／ ｜ — — | 4 2 1 1 |
| 幺 | ㄥ ㄥ 、 | 6 6 3 |

| Name | Horizontal | Vertical | Dot | Dash | Clockwise | Counter-clockwise |
|---|---|---|---|---|---|---|
| Stroke | 一 | 丨 | 丶 | ノ | 𠃌 | ㇄ |
| Symbol | 1 | 2 | 3 | 4 | 5 | 6 |

| Characters | Strokes in sequence | Spelling numbers |
|---|---|---|
| 上 | 丨 一 一 | 2 1 1 |
| 天 | 一 一 ノ 丶 | 1 1 4 4 |
| 火 | 丶 丶 ノ 丶 | 3 3 4 4 |
| 亡 | ノ 丨 一 一 | 4 2 1 1 |
| 幺 | ㇄ ㇄ 丶 | 6 6 3 |

| Characters | Corresponding spelling numbers |
|---|---|
| 乙 | $5^6$ |
| 力 | $45^5$ |
| 凸 | $2125^65_1$ |

1 quartet
(44): ㄨ 人 入 八

4 triads
(121) : 士 土 工
(4112) : 丰 午 牛
(25112): 叶 甲 申
(25111): 且 旦 目

33 pairs
(45⁶): 九 几
(115): 宁 于
(442): 个 彳
(516): 己 巳
(1443): 太 犬
(1511): 日 曰
(4444): 从 乂
(14251): 右 石
(32545⁶): 宂 宄
(45⁵251): 加 句
(411244): 朱 耒
(2511112): 旰 旱
(1244121): 杜 杠
(25125112): 呷 呻
(2512145⁵11): 胄 胃
(3143325111): 疸 疽
(251131251533): 景 晾

| characters | spellings |
|---|---|
| 士 | 1 2 1 $S_1$ |
| 土 | 1 2 1 $S_2$ |
| 工 | 1 1 1 $S_3$ |

INPUT SYSTEM FOR SINO-COMPUTER

The present invention relates to an input system applicable to a Sino-computer for greatly simplifying the operation and input speed.

Computerization of Chinese characters has been under development. The critical point is how to simplify and speed up the input operation to a satisfactory extent. There have been various suggestions made in this direction, but little has been accomplished.

The primary object of the present invention is to provide a Chinese computerized input method by analyzing all Chinese characters, reducing them to six basic strokes, i.e. horizontal, vertical, dot, dash, clockwise and counterclockwise, and giving each stroke a corresponding designated numerical symbol, thereby, according to the conventional exact stroke writing sequence of any character, to give the same a spelling number to represent said character, to facilitate and simplify the input operation.

According to the present method, characters that require the same spelling but different writing in the vocabulary are relatively few, only 33 pairs, 3 triads and 1 quartet. These same spelling characters can be distinguished by additional selective keyboards during input without mistake.

Another object of the present invention is to provide a Sinotype for carrying out the input method as mentioned above, which comprises only 6 basic stroke keyboards, 2 affix stroke keyboards and several selective keyboards.

A modified embodiment of the Sinotype according to the present invention additionally provides radical keyboards to further increase input speed.

The invention is illustrated, by way of example, in the attached drawings, in which:

FIG. 4 illustrates identical spelling characters;

FIG. 5 shows the triads of a spelling number; and

Figures 1, 2, 3, 6:
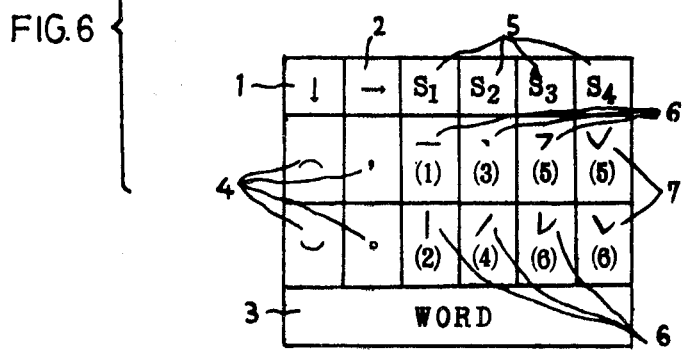
FIG. 1 illustrates the number symbols of each stroke of the Chinese characters.
FIGS. 2 and 3 illustrate several Chinese characters, strokes in sequence and the corresponding spelling numbers.
FIG. 6 illustrates the keyboards used in this invention.

Now, the present invention will be described with reference to the preferred embodiment, in which the corresponding designated numerical symbol can be varied in an appropriate manner or changed with the order thereof. However, it is unnecessary to be limited here accordingly.

In this embodiment, the corresponding designated number symbols of each stroke are shown in FIG. 1. Every Chinese character can be composed from these six strokes and given a representative spelling number consisting of a series of said corresponding designated number symbols in the order of conventional writing sequence from up to down and from left to right of all strokes comprised in said character. For example, see FIG. 2.

As regards the strokes of clockwise and counterclockwise, when there are more than two deflections or segments to a stroke, then a sub-symbol is affixed at the left upper position of the main symbol. For example, if the second segment of a stroke is clockwise, as a sub-symbol the number "5" is affixed, otherwise add "6" in case of counterclockwise. The third segment is treated in the same manner, see FIG. 3.

Figures 4, 5:
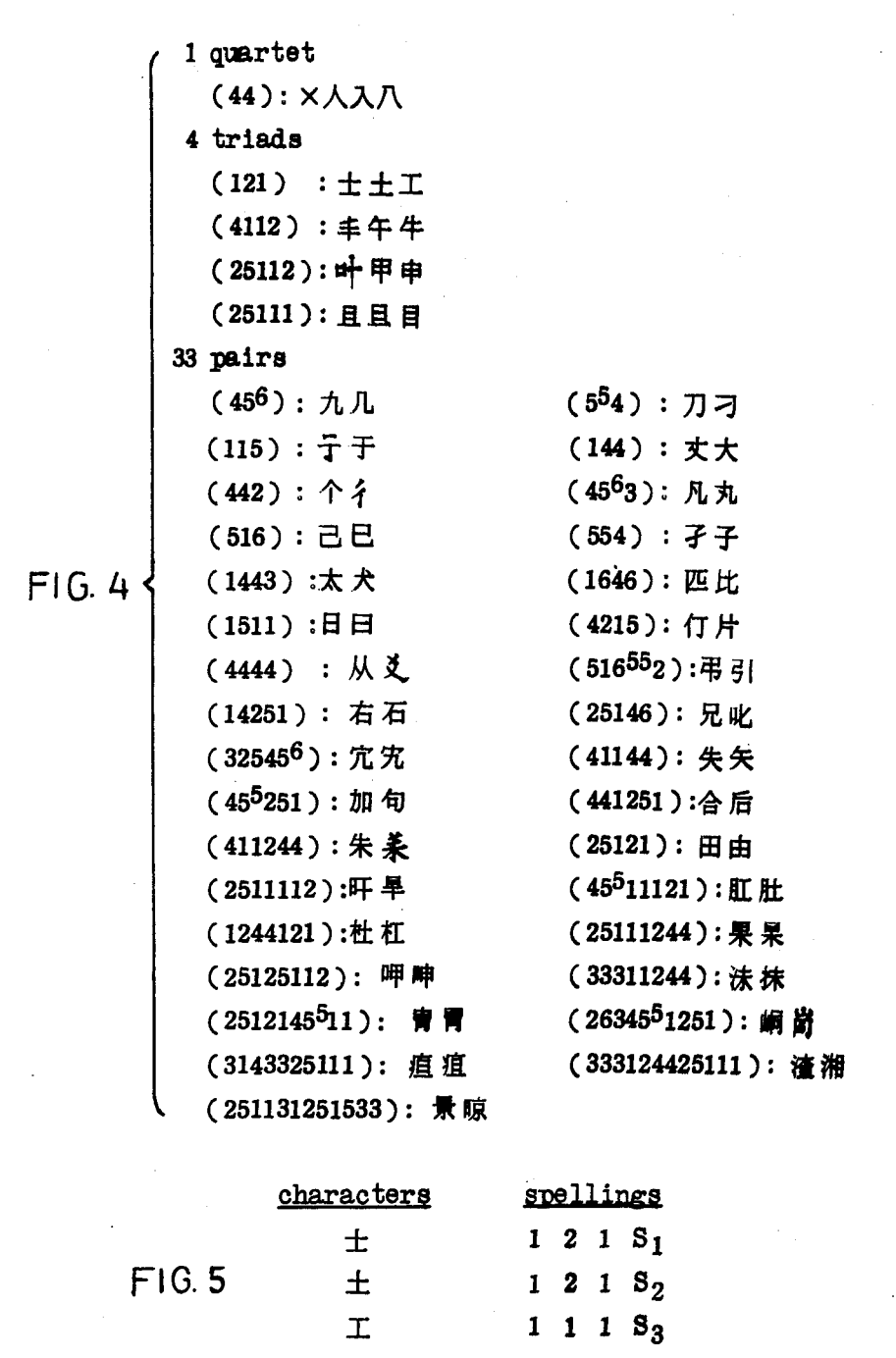

In the commonly used 9600 Chinese characters, there are relatively few of the same spelling but different writing. This is one of the features of the present invention. These same spelling characters are shown in FIG. 4.

These same spelling characters are summarized according to the number of strokes in the following table:

| number of strokes | 1 | 2 | 3 | 4 | 5 | 6 | 7 | 8 | 9 | 10 | 11 | 12 | 13 | 14 | Total |
|---|---|---|---|---|---|---|---|---|---|---|---|---|---|---|---|
| number of same spelling character | | | | | | | | | | | | | | | |
| pairs | 0 | 2 | 6 | 6 | 6 | 2 | 3 | 3 | 2 | 1 | 0 | 2 | 0 | 0 | 33 |
| triads | 0 | 0 | 1 | 1 | 2 | 0 | 0 | 0 | 0 | 0 | 0 | 0 | 0 | 0 | 4 |
| quartet | 0 | 1 | 0 | 0 | 0 | 0 | 0 | 0 | 0 | 0 | 0 | 0 | 0 | 0 | 1 |

Those same spelling characters can be displayed on the screen by means of a Visual Display, the operator can search them by eye and then push the corresponding selective keyboards $S_1$, $S_2$, $S_3$ and $S_4$. The selection is quite easy due to the limited number of identical spelling characters.

The triads of the spelling number 121 for example, are represented in FIG. 5.

As regards some characters with ambiguous stroke writing sequence, two or more spelling numbers corresponding to available stroke sequence can be given to one character. In this case, the input signal may comprise two or more different spelling numbers, but they are identified in the memory, so that only one and the same character will be output in response to either one of such input spelling numbers. Therefore, even though the stroke writing sequence may be different, an exact character output can be assured. Actually, such ambiguous characters are quite few, so it is not difficult to handle.

According to reliable statistics, the Chinese characters have 12 strokes on the average, in other words, 12 spelling numbers, compared to an average of 9 alphabets in English words, 9 in French, 11 in German and 10 in Russian. With this comparison, it is apparent that the typing speed for input of these different languages is similar.

The input system according to the present invention may combine the stroke and radical for reducing the times of pushing keyboards. In this case, the operation of pushing keyboards for Chinese character will be reduced below 9 times on the average.

The Sinotype designed according to this method comprises six basic strokes, 2 affix strokes, selective, radical and sign keyboards, and is schematically illustrated in FIG. 6.

In FIG. 6, 1 represents the keyboard for actuating the tape punching machine moving downward.

2 represents the keyboard for actuating the tape punching machine moving rightward.

3 represents the keyboard for registering one complete character being finished.

4 represents various sign keyboards.

5 represents selective keyboards.

6 represents six stroke keyboards.

7 represents affix stroke keyboards.

8 represents radical keyboards.

An inexpensive Sinotype can be made according to the input system for the Sino-computer of the present invention. The paper tape after operation may be delivered to a data processing section. The operation is very easy in accordance with the stroke writing sequence of Chinese character without requiring a skilled operator.

This tape punching machine may be attached to a synchronous electric typewriter to type out the entire text simultaneously during the operation of said tape punching machine for checking out whether any wrong input is being made.

The aforementioned embodiments serve only for illustrative purposes and by no means restrict the scope of the present invention. Any modifications can easily be made by those skilled in the art and should be considered within the scope of the attached claims.

What I claim is:

1. A method of entering Chinese characters into an input system of a Sino-Computer, comprising: dividing each Chinese character into six basic strokes, said strokes including horizontal, vertical, dot, dash strokes and clockwise strokes and counterclockwise strokes, assigning each of said strokes a numerical equivalent, and entering said numerical equivalent into said input system in an order determined by the sequence in which said strokes appear in the respective character, said order being first from up to down and then from left to right, and with clockwise and counter-clockwise strokes having more than two segments, affixing to its respective numerical equivalent a sub-symbol corresponding to the clockwise and counter-clockwise direction of the segment, respectively.

2. A method according to claim 1, wherein the numerical equivalent of said horizontal, vertical, dot, dash, clockwise and counter-clockwise strokes is 1, 2, 3, 4, 5 and 6, respectively.

3. A method according to claim 2, wherein when said clockwise stroke has more than two segments, affixing at the corresponding numerical equivalent of "5" a sub-symbol selected from the group consisting of "5" and "6" corresponding to the respective clockwise and counter-clockwise direction of the second and third segments.

4. A method according to claim 2, wherein when said counter-clockwise stroke has more than two segments, affixing at the corresponding numerical equivalent of "6" a sub-symbol selected from the group consisting of "5" and "6" corresponding to the respective clockwise and counter-clockwise direction of the second and third segments.

* * * * *